(12) United States Patent
Lu et al.

(10) Patent No.: US 6,546,539 B1
(45) Date of Patent: Apr. 8, 2003

(54) NETLIST RESYNTHESIS PROGRAM USING STRUCTURE CO-FACTORING

(75) Inventors: Aiquo Lu, Cupertino, CA (US); Ivan Pavisic, San Jose, CA (US); Pedja Raspopovic, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 224 days.

(21) Appl. No.: 09/736,571

(22) Filed: Dec. 14, 2000

(51) Int. Cl.[7] .............................................. G06F 17/50
(52) U.S. Cl. ................................ 716/12; 716/6; 716/13
(58) Field of Search ...................... 716/2, 4–13, 14–18; 703/19

(56) References Cited

U.S. PATENT DOCUMENTS

| | | | |
|---|---|---|---|
| 5,452,239 A | * 9/1995 | Dai et al. ..................... 703/19 |
| 5,526,514 A | 6/1996 | Pradhan et al. |
| 5,778,216 A | * 7/1998 | Venkatesh .................. 713/500 |
| 5,875,117 A | 2/1999 | Jones et al. |
| 5,917,728 A | 6/1999 | Ueda |
| 5,999,715 A | 12/1999 | Sato |
| 6,009,248 A | 12/1999 | Sato et al. |
| 6,030,110 A | 2/2000 | Scepanovic et al. |
| 6,038,385 A | 3/2000 | Scepanovic et al. |
| 6,068,662 A | 5/2000 | Scepanovic et al. ........... 716/2 |
| 6,075,933 A | 6/2000 | Pavisic et al. |
| 6,085,032 A | 7/2000 | Scepanovic et al. |
| 6,124,736 A | * 9/2000 | Yamashita et al. .......... 326/106 |
| 6,170,075 B1 | * 1/2001 | Schuster et al. ............ 714/776 |
| 6,272,668 B1 | * 8/2001 | Teene .......................... 716/10 |
| 6,396,307 B1 | * 5/2002 | Kawakami et al. ......... 326/121 |

OTHER PUBLICATIONS

"Combining Technology Mapping with Post–Placement Resynthesis for Performance Optimization" by A. Lu et al., *IEEE*, pp. 616–621, (1998).
"Computing the Area Versus Delay Trade–Off Curves in Technology Mapping" by K. Chaudhary et al., *IEEE*, pp. 1480–1489, (1995).
"Delay Estimation and Optimization of Logic Circuits: A Survey" by M. Fujita et al., *IEEE* pp. 25–30, (1997).
"Multi–Level Logic Optimization by Implication Analysis" by W. Kunz et al., *ACM*, pp. 6–13, (1994).
"Post–Layout Logic Restructuring for Performance Optimization" by Y. Jiang et al., *ACM*, pp. 662–665, (1997).
"Post–Layout Optimization for Deep Submicro Design" by K. Sato et al., *ACM*, pp. 740–745, (1996).
"Technology Mapping of LUT based FPGAs for Delay Optimisation" by X. Lin et al, *FPL*, pp. 245–254 (1997).
"Timing Driven Placement in Interaction with Netlist Transformations" by G. Stenz et al., *ISPD*, pp. 36–41, (Apr. 1997).

\* cited by examiner

*Primary Examiner*—Matthew Smith
*Assistant Examiner*—Paul Dinh
(74) *Attorney, Agent, or Firm*—Westman, Champlin & Kelly

(57) ABSTRACT

A program for improving a netlist of logic nodes and physical placement for an IC. The program (A) identifies critical nodes based on time calculated from a physical placement. The program (B) selects a set of critical nodes and sub-netlists associated with the critical nodes and co-factors critical fan-ins in the sub-netlists. The program remaps the sub-netlists by optimization and dynamically estimates and updates fanout loads. The program returns to step B if the remapped sub-netlist is unacceptable, returns to step A if the remapped sub-netlist is acceptable, and exits at step A when no more critical nodes are identified at step A.

8 Claims, 7 Drawing Sheets

NETLIST RESYNTHESIS PROGRAM USING STRUCTURE CO-FACTORING

CROSS REFERENCE TO RELATED APPLICATION

Reference is made to an application Ser. No. 09/737,239, filed on even date herewith titled "NETLIST RESYTHESIS PROGRAM BASED ON PHYSICAL DELAY CALCULATION".

FIELD OF THE INVENTION

The present invention relates to the design of integrated circuits (ICs) using computer-aided design and computer-aided engineering programs (CAD/CAE). In particular, the present invention relates to CAD/CAE programs that optimize the design of an IC.

BACKGROUND OF THE INVENTION

The design process for an integrated circuit (IC) is a process of transforming a specification for desired logic or analog functions to a physical or geometric arrangement for an IC die that can perform the desired functions. Modern integrated circuits, particularly VLSI circuits, are very complex and various stages in the design process are automated using CAD/CAE software tools.

Typically, a technology mapping program will be used to convert a specification into an arrangement of library elements, such as gates, and interconnections. The output of the technology mapping process is a trial netlist which lists the library elements used and their interconnections, also called nodes. The technology mapping process is iterative and several trial netlists may be tried before an accepted netlist is found that has acceptable delays for each node based on a simplified delay calculation performed as part of the technology mapping. Typically, this mapping process includes the simple use of a Shannon expansion theorem equation to co-factor a Boolean function. The Shannon expansion theorem equation is used to move an input with a late arrival closer to the output of the Boolean function. This simple step, however, does not take into account the duplication of logic elements in the Boolean function and does not take into account the delays of the logic elements used to implement the Boolean function.

Next, a physical placement program is used to specify geometric locations for each library element and also a geometric path for each interconnect. After a trial physical placement is made, a more complex delay calculation is made that takes into account the physical placement of the library elements and the interconnections. As the more complex delay calculation identifies critical nodes with excessive delays, the physical placement is iteratively repeated to reduce the delay to an acceptable amount. In some cases, the delay does not converge to an acceptable delay, and development activity returns to the technology mapping program to generate another accepted netlist to be tried by the physical placement program.

At the end of the process, an accepted netlist and global placement are created that may satisfy the delay requirements, however, because of the limitations of the simple Shannon theorem calculations made in the technology mapping program, the netlist and global placement may not be optimized well for implementation as an IC.

A program is needed that will optimize the netlist and the global placement, eliminate duplication of logic elements and account for logic element delay in the logic co-factoring process.

SUMMARY OF THE INVENTION

Disclosed is a program for improving a netlist of logic nodes and physical placement for an IC. The program (A) identifies critical nodes based on time calculated from a physical placement. The program (B) selects a set of critical nodes and sub-netlists associated with the critical nodes and co-factors critical fan-ins in the sub-netlists. The program remaps the sub-netlists by optimization and dynamically estimates and updates fanout loads. The program returns to step B if the remapped sub-netlist is unacceptable, returns to step A if the remapped sub-netlist is acceptable, and exits at step A when no more critical nodes are identified at step A.

DETAILED DESCRIPTION OF THE ILLUSTRATED EMBODIMENTS

In the present invention, a CAD/CAE optimization program is provided that operates on a netlist and global placement provided by a CAD/CAE design program to generate a final physical placement that is optimized for timing delays. In the optimization program, a timing delay that is calculated as a function of physical placement is used to remap a sub-netlist using co-factoring. The co-factoring is based on timing delay at an output node of a sub-netlist. The problems with using a simple timing delay calculation that does take into account delays in the sub-netlist are avoided, and the sub-netlist is optimized. Logic duplications can be eliminated as part of the optimization. The program can be operated at more than one hierarchical level in the netlist to achieve improved results.

Figure 1:
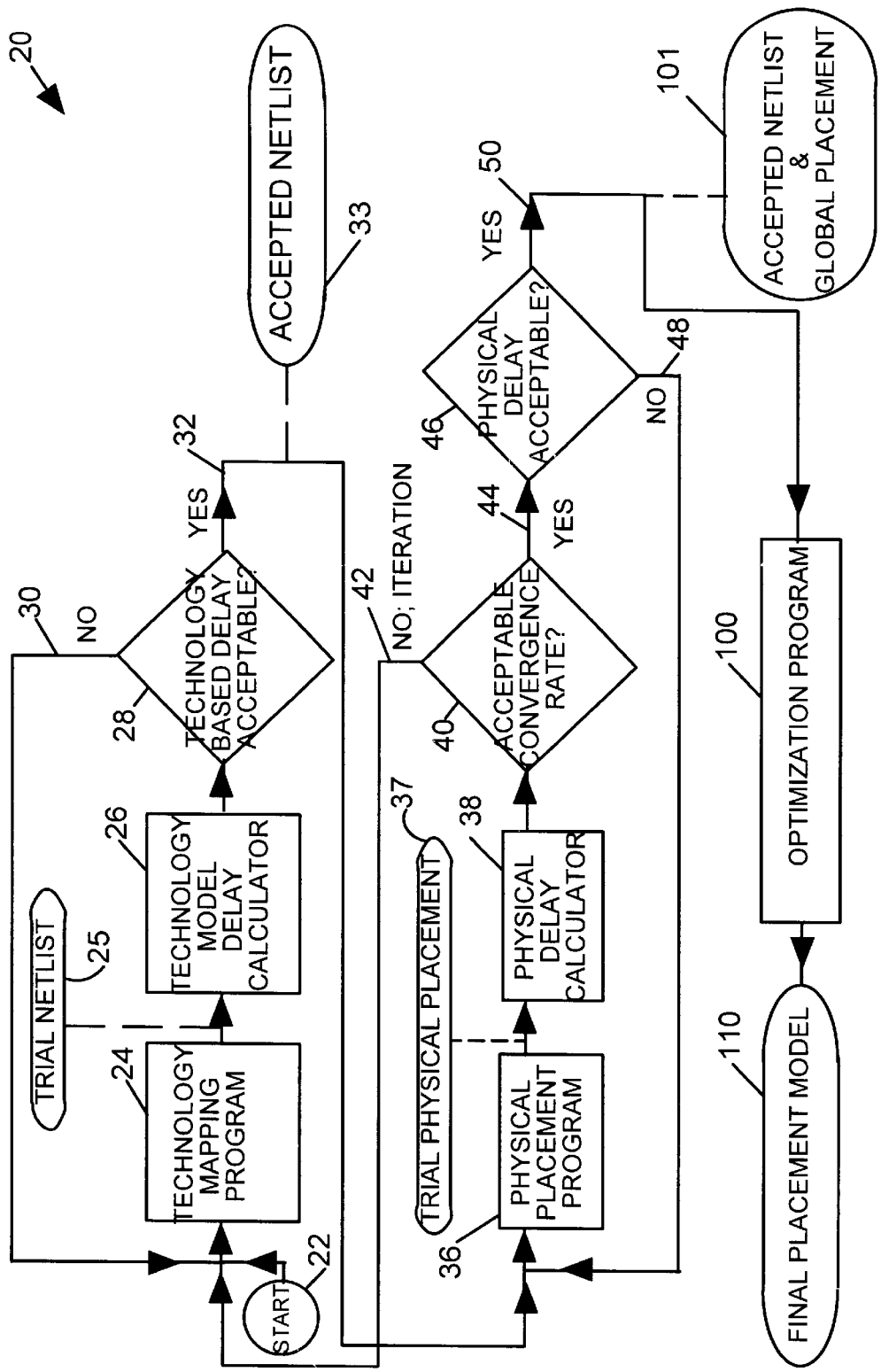
FIG. 1 illustrates a simplified flow chart of generating a global placement and subsequent optimization of an IC design.

FIG. 1 illustrates a generalized flow chart 20 of a design process of generation of an accepted netlist and global placement 101 for an IC design, and also an optimization program 100 for the IC design that generates a final placement 110 that is optimized. The final placement 110 is an optimized physical or geometric arrangement for an IC die that can perform the desired functions.

The processes illustrated in FIG. 1 are typically performed using a conventional digital computer that includes a central processor unit (CPU), read-only memory (ROM), random-access memory (RAM) and various input/output output devices. The trial netlist 25, the accepted netlist 33, the accepted netlist and global placement 101 and the final placement model 110 are typically arranged as one or more computer files that can be stored or transferred on computer readable media such as CD-ROM's, a hard disk or other magnetic media. The final placement model 110 is typically used to generate patterned masks used to manufacture semiconductor wafers embodying the IC design. The semiconductor wafers are then diced into individual integrated circuit dies that embody the IC design. The program for network resynthesis 100, or the entire program 20, can be stored as a set of instructions on computer-readable media that are executed by the digital computer.

The design process for an integrated circuit (IC) starts with a specification for some desired logic or analog functions at start 22 in FIG. 1. This specification can take the form of a list of Boolean formulas and may also include synchronization or timing requirements. The specification can be entered from a keyboard or it can be entered as file or group of files stored on computer-readable media. A technology mapping program 24 converts the specification into a trial netlist 25, in other words, a list of library elements, such as gates, and a list of the interconnections between the elements. The output of the technology mapping program 24 is the trial netlist 25 which lists the library elements used and their interconnections, also called nodes. The technology mapping program 24 is performed iteratively and several trial netlists 25 may be tried before one is found that has acceptable delays for each node based on a simplified delay calculation performed in delay calculator 26 as part of the technology mapping. Delay calculator 26 can calculate delays based on the number and types of elements that are interconnected at each node specified in the current trial netlist 25, but it is not capable of adequately taking into account the physical size and placement of the interconnections. Delays calculated in delay calculator 26 are tested at decision point 28 to determine if all delays at all nodes are acceptable. If one or more delays are found to be not acceptable, program flow returns along line 30 to generate another trial netlist 25 at technology mapping program 24. Once the delays for all of the nodes in a trial netlist are found to be acceptable at decision point 28, then program flow continues along line 32 with an accepted netlist 33 to a physical placement program 36. Physical placement program 36 generates a trial physical placement 37 for the elements and interconnection nodes of the IC. The physical placement program 36 is used to specify geometric locations for each library element and also a geometric path for each interconnect. Each interconnect or node connects to an output of an element and fans out to connect to one or more inputs of other elements of the IC. Next, a more accurate delay calculator 38 calculates delays for all of the nodes. The delay calculator 38 takes into account the complex physical placement of the library elements and the interconnections and how they affect capacitive loading and other sources of delay. The more complex delay calculations made in delay calculator 38 identify critical nodes with excessive delays. The physical placement program 36 is iteratively repeated to reduce the delays to an acceptable amount. If delay calculator 38 identifies critical nodes at which delay is unacceptable, then the rate of iterative convergence of the delay is tested at decision point 40. If the delay is not converging, or if the delay is converging too slowly, the program flow goes back at 42 to complete another iteration of technology mapping starting at technology mapping program 24.

If the delay is converging at an acceptable rate at decision point 40, then the program flow continues along line 44 to decision point 46. The physical delays calculated at delay calculator 38 are tested at decision point 46 to see if all of the delays are acceptable. If one or more of the delays are found not acceptable at decision point 46, then program flow goes back along line 48 to try another iteration of physical placement at 36. Once all of the delays are acceptable, then program flow continues from decision point 46 along line 50 to optimization program 100. This provides optimization program 100 with an accepted netlist and global placement 101.

The accepted netlist and global placement 101 satisfies the delay requirements, however, because of the limitations of the simple delay calculations made in the technology model delay calculator 26, the accepted netlist and global placement 101 may not be optimized well for implementation as an IC.

A program is needed that will further optimize the accepted netlist and the global placement 101 without the limitations imposed by the simple delay calculations in the technology model delay calculator 26. Optimization program 100 of FIG. 1 performs the further optimization that is needed, as explained below in connection with examples illustrated in FIGS. 2–8.

The optimization program 100 performs timing driven technology re-mapping in a placement program using co-factoring of critical nodes based on timing delays at the outputs of the critical nodes. An important advantage that can be achieved with optimization program 100 is elimination of logic duplications within a sub-netlist associated with the critical node.

In the hierarchical design of a very large scale integrated (VLSI) circuit, technology mapping program 24 has the freedom to change the netlist structure, but it does not have access to the physical interconnect information. On the other hand, the physical placement program 36 has more detailed interconnect information, but it has limited capability to change the netlist structure. Unlike the current methodology which relies on iterations along line 42 between a technology mapping program and a placement program to achieve timing closure (e.g., as described in "Timing Driven Placement in Iterations with Netlist Transformation," Guenter Stent et al., pages 36–41, ISPD'97, April 1997), optimization program 100 provides a program in which co-factoring and a physical delay calculator interact with one another directly to provide a more optimum result.

In optimization program 100, whether the re-mapped sub-netlist is acceptable or not is determined based on the same type of delay calculator as that used in a physical placement program. This is, of course, much more accurate than the delay calculation (whether it is based on the wire load delay model or the back-annotated custom wire load delay model) used in technology mapping programs (e.g., as described in "Combining Technology Mapping with Post-Placement Resynthesis for Performance Optimization," Aiguo Lu et al., pages 616–621, ICCD'98, October 1998) which estimates the interconnect delay based on the fanout count of the subject graph. This important factor is changing dynamically during the remapping process.

Figure 2:
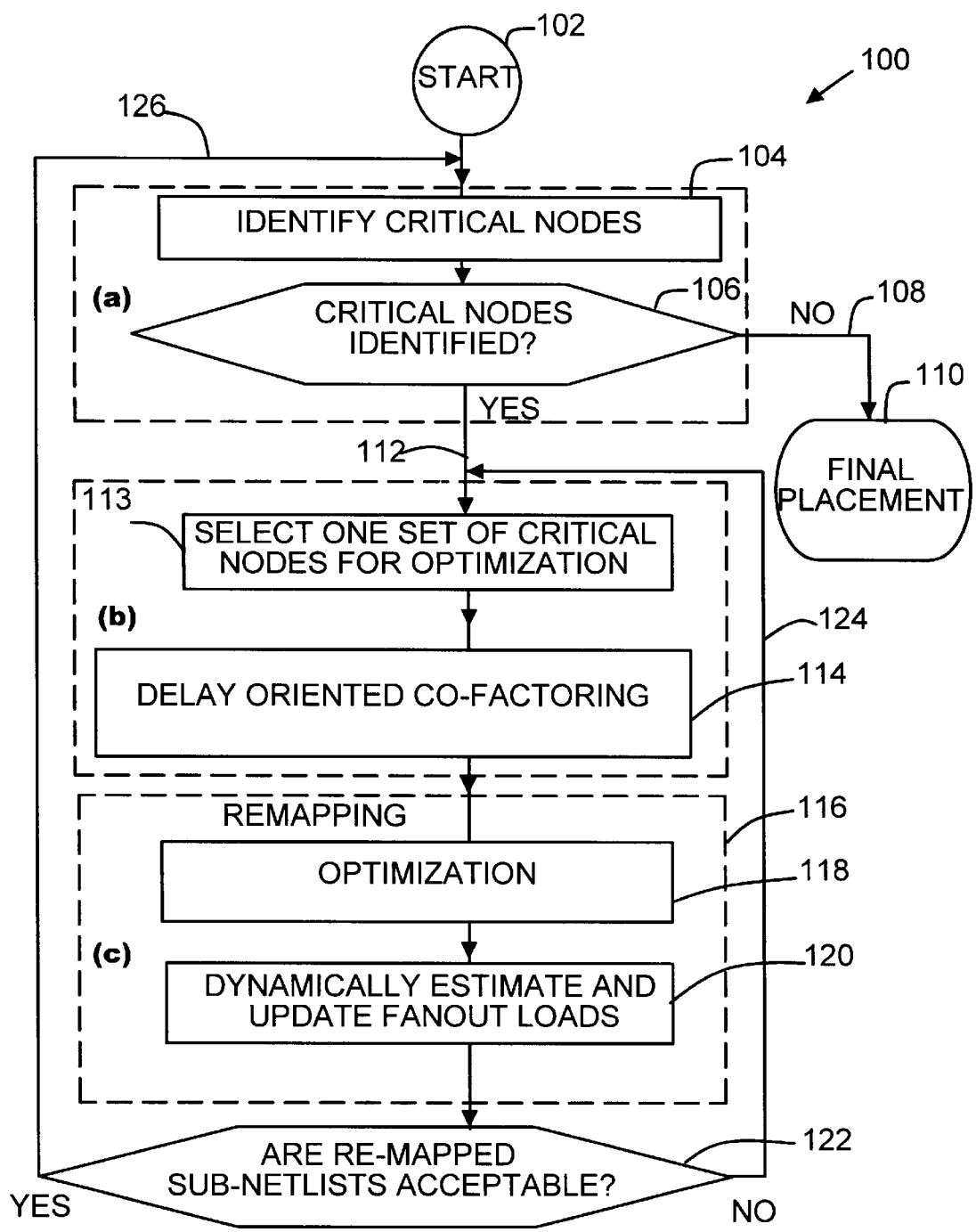
FIG. 2 illustrates a simplified flow chart of an optimization program for an IC design using delay-oriented co-factoring.

FIG. 2 shows a simplified flowchart of an example of an optimization program 100 that uses an in-placement timing driven re-mapping process after delay oriented co-factoring. Starting at 102 from calculated delay information after global placement 101 (FIG. 1), critical nodes are identified based on physical placement at step 104. If there are no critical nodes identified, then no more sub-netlist is left for re-mapping at decision point 106, in other words the re-mapping process is complete, and the program proceeds along line 108 to provide a final placement 110. If there are one or more critical nodes identified at decision point 106, the re-mapping process starts at line 112 and comprises several steps:

(1) a set of critical nodes is selected for optimization of a selected sub-netlist at process step 113.

(2) co-factoring on a critical node based on a delay calculation of a critical fan-in as the delay appears at the node output is performed at step 114. This calculation is explained in more detail in connection with an example described below in connection with FIG. 5.

(3) as part of a remapping process 116, the critical node is remapped, along with portions of associated non-critical nodes at process 118. The process 118 preferably includes elimination of logic element duplications.

(4) as part of the remapping process 116, fanout loads are dynamically estimated and updated based on physical delay calculations at process 120.

After the sub-netlist is re-mapped, the program checks whether the result is acceptable or not at decision point 122. If acceptable, the re-mapped sub-netlist with estimated coordinates is then merged into the netlist, the in-placement delays are updated, and program flow proceeds along line 126 to step 104 to repeat the process. If not acceptable, program flow proceeds along line 124 to select another set of critical nodes for re-mapping at step 113. An advantage of this exemplary re-mapping algorithm in steps (1) and (4) above is an innovative delay oriented co-factoring algorithm that eliminates logic duplication and selects the signal to be co-factored based on both the signal's arrival time and its sensitivity to the Boolean function's delay.

Simple delay-oriented cofactoring can reduce the delays of mapped netlist. This simple cofactoring is based on the Shannon expansion theorem equation:

$$f = x f_x + X' f_{x'} \qquad \text{Equation 1}$$

where f is the Boolean function to be cofactored, x is the latest input signal (or the input with the largest arrival time among all f's inputs), $f_x$ is f with input x set to 1, and is $f_{x'}$ is f with x set to 0.

Figure 4:
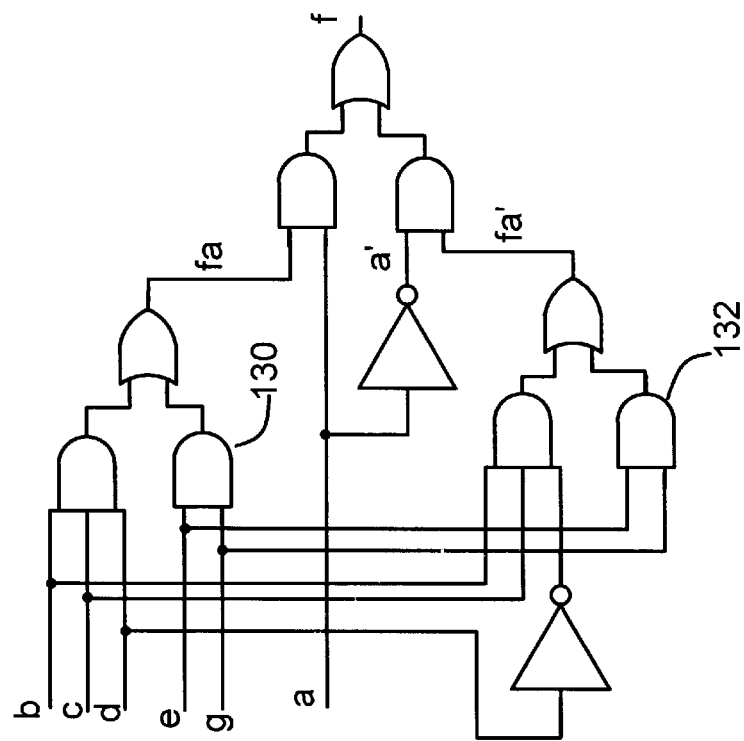
FIG. 4 illustrates the circuitry of FIG. 3 after simple co-factoring.
Figure 3:
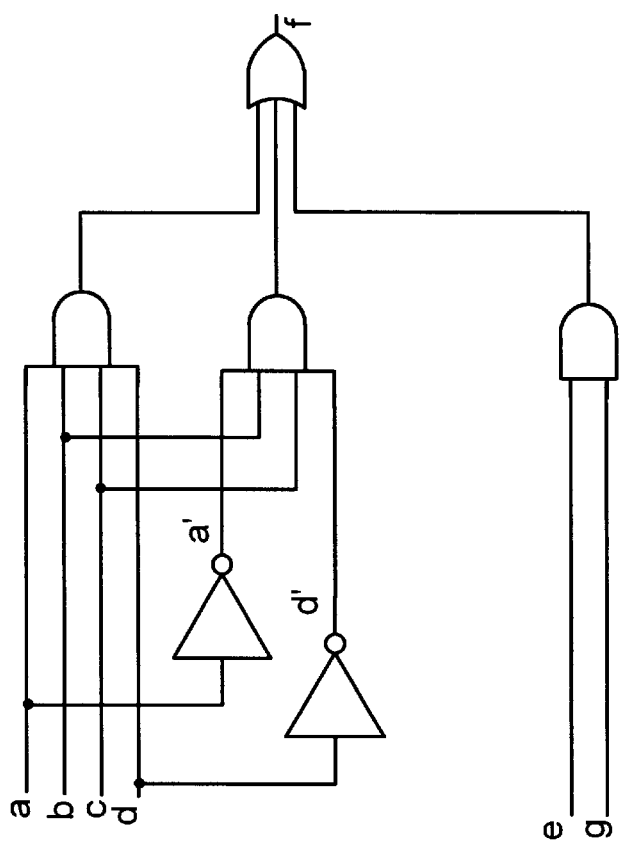
FIG. 3 illustrates circuitry represented by a sub-netlist before simple co-factoring.

In FIG. 3, for example, f=abcd+a'bcd'+eg, and the relative arrival times of inputs a, b, c, d, e, g are 2, 1, 1, 1, 0.5, 1, respectively. These arrival times are in units of time, such as nanoseconds for example, after some reference point in time such as the edge of a system clock waveform. In this example, "a" is the latest arriving input signal. So it is selected for cofactoring using Equation 1, giving the result shown in Equation 2:

$$f = a f_a + a' f_{a'} \qquad \text{Equation 2}$$

where $f_a$=bcd+eg and $f_{a'}$=bcd'+eg. This is illustrated in FIG. 4. This brings the latest arrival signal "a" closer to the f's output, thus reducing the delay. In FIG. 3, input "a" propagates through a four-input AND gate and a three-input OR gate before reaching output f. In FIG. 4, input "a" propagates through a two-input AND gate and a two-input OR gate before reaching output f. When this simple cofactoring algorithm is applied in the in-placement re-mapping process, the arrival time of each input is provided by placement, which is more accurate than that in logic synthesis. Simple cofactoring, as illustrated in FIGS. 3,4, is used in post-placement re-mapping, however it has some limitations.

Simple cofactoring has an inherent limitation of creating logic duplications if the variable selected is not covered by each cube of the function. In the example illustrated in FIGS. 3, 4, for example, the cube eg is duplicated after cofactoring in AND gate 130 and also AND gate 132 of FIG. 4. For the example f=abcd+a'bcd'+eg, "a" is not covered in cube eg. So this cube is duplicated (both $f_a$ and $f_{a'}$ have the cube eg formed by duplicate gates 130, 132). The duplication of logic increases the physical circuit area and also the circuit delay. The problem becomes much worse as the duplicated logic netlist grows larger and/or more complex in a VLSI circuit. Simple co-factoring cannot effectively extract the common logic elements of the function.

In another example (not illustrated), f=ax+bx+cx+dx+ay+by+cy+dy. Using simple cofactoring with x as the latest arriving input gives f=xfx+x'fx', fx=a+b+c+d, and fx'=ay+by+cy+dy. So the simple cofactored netlist becomes f=x(a+b+c+d)+x' (ay+by+cy+dy). However the best common logic extraction might give f=(x+y) (a+b+c+d). The simple cofactoring process, however, doesn't identify and eliminate this kind of duplication.

If this cofactoring algorithm is used in technology-dependent logic optimization, there are other optimization algorithms (e.g., resubstitution, decomposition, and multiple-function logic extraction) in iterations that can be performed to solve this problem. However, In the in-placement remapping process which is both technology-dependent and placement-dependent, the iterations of these other optimization algorithms becomes too computationally time-consuming to be practically useful.

Figure 5:
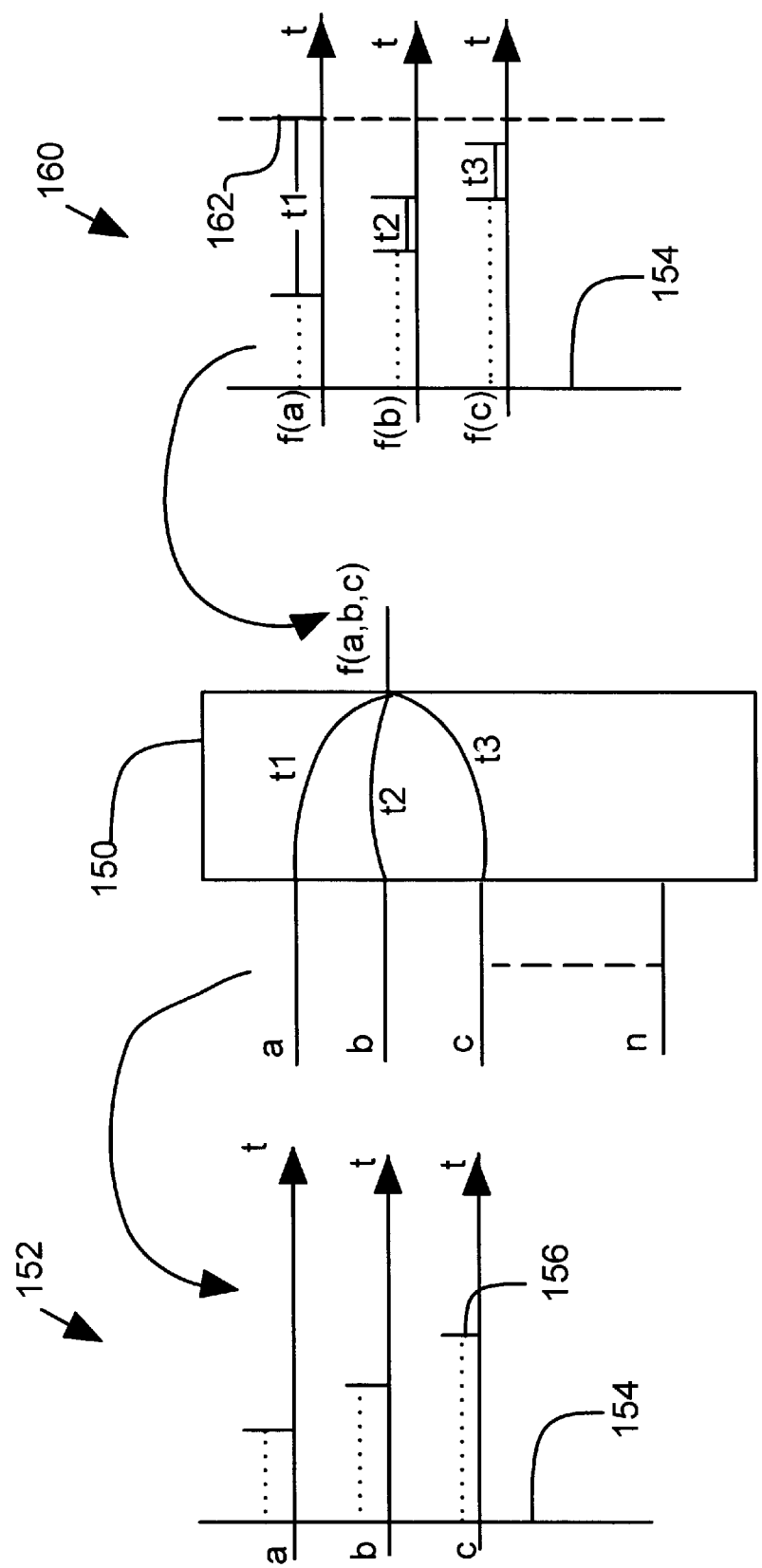
FIG. 5 illustrates arrival times of logic inputs a, b and c to a network with differing delay times for each input and corresponding delayed arrival times at an output f.

As illustrated in FIG. 5, simple delay-oriented cofactoring algorithms selects the input variable to be decomposed based the latest arrival time of the inputs. FIG. 5 illustrates a sub-netlist 150 that has input nodes a, b, c and an output node f which is a Boolean function that includes at least a, b and c. The timing diagram 152 illustrates the delays of inputs signals a, b, c relative to a system timing reference 154 such as a clock edge. As illustrated in timing diagram 154, the input signal c has the critical fan-in or longest delay as illustrated at 156. A simple co-factoring strategy base on input c being the critical fan-in does not give satisfactory results because the arrival time at the output of function f is based on not only the arrival times of its inputs but also depends on delays of logic elements in the sub-netlist 150 itself. In FIG. 5, the delay from input a to the output f is t1, the delay from input b to output f is t2 and the delay from input c to the output f is t3. Some inputs are subject to large delays before they reach the output f, while other inputs are subject to smaller delays before they reach the output f, depending on the physical arrangement of the logic in sub-netlist 150.

The timing at the output f is illustrated in timing diagram 160 where the input-to-output delays t1, t2, t3 are added to the corresponding delays of the inputs a, b, c respectively. Based on this more complex delay calculation, it can be seen that the latest input signal to be propagated to the output f is a as illustrated at 162. The input a is therefore selected as a critical fan-in to be used for co-factoring, based on this more complex timing delay calculation.

Another problem with simple cofactoring is that the arrival time is based on the load of input signals. During simple cofactoring, this information is not available. If the arrival time in the simple implementation is used, it will become inaccurate after co-factoring and its new implementation.

The delay-oriented cofactoring algorithm illustrated in FIG. 2 cofactors Boolean functions based on a pre-mapped netlist structure 101 so that both arrival time of inputs and the sensitivity of inputs to the Boolean function's delay are taken into account. In addition, the algorithm can extract common or duplicate logic functions and reduce the logic duplications which are the inherent problems in the simple cofactoring algorithm.

Figure 6:
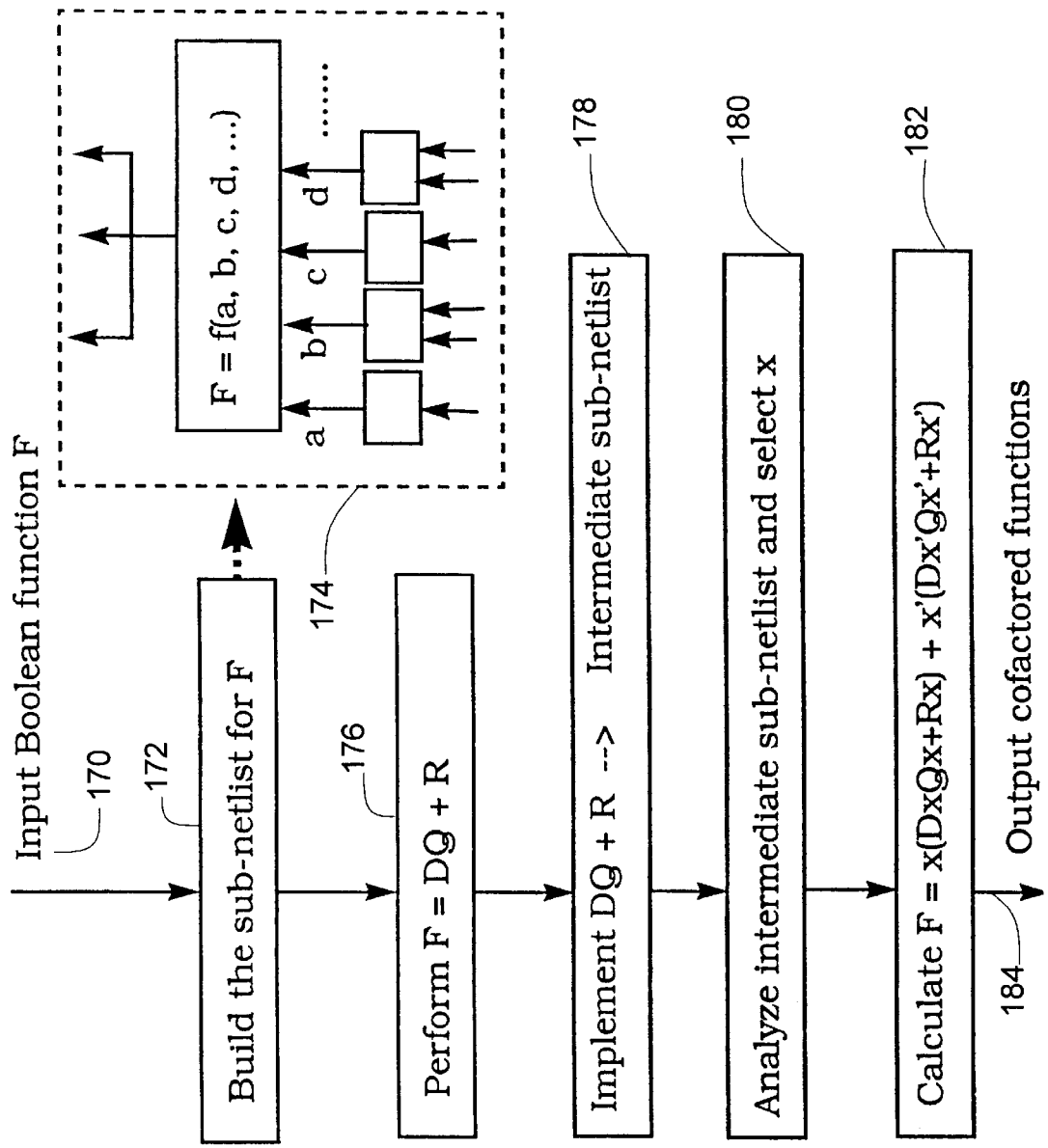
FIG. 6 illustrates a first exemplary process of structure dependent co-factoring.
Figure 7:
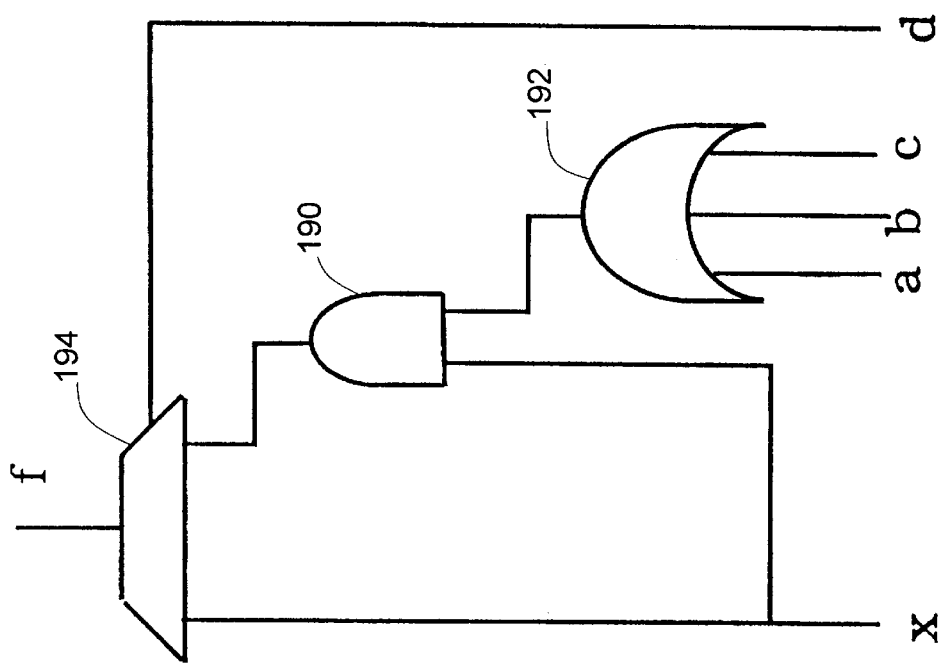
FIG. 7 illustrates a first example of a sub-netlist before (a) and after (b) structure-dependent Co-factoring.
Figure 7:
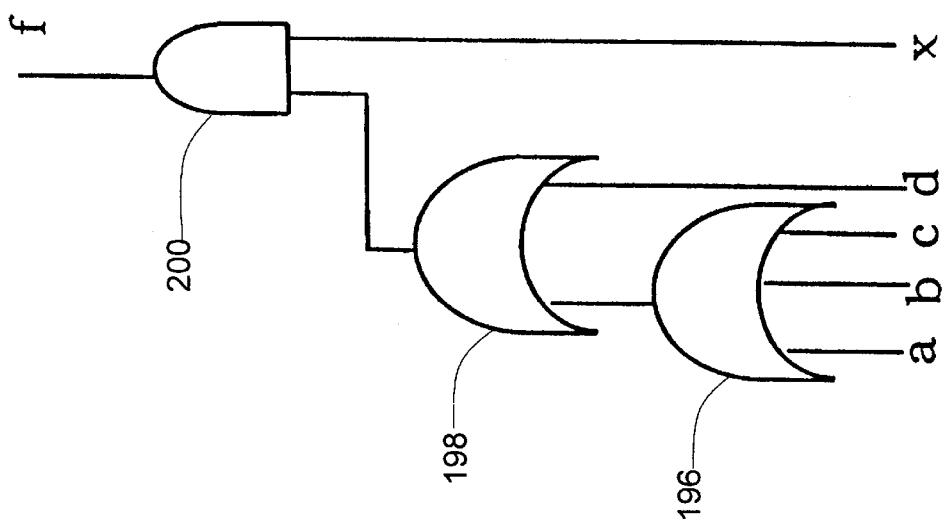
Figure 8:
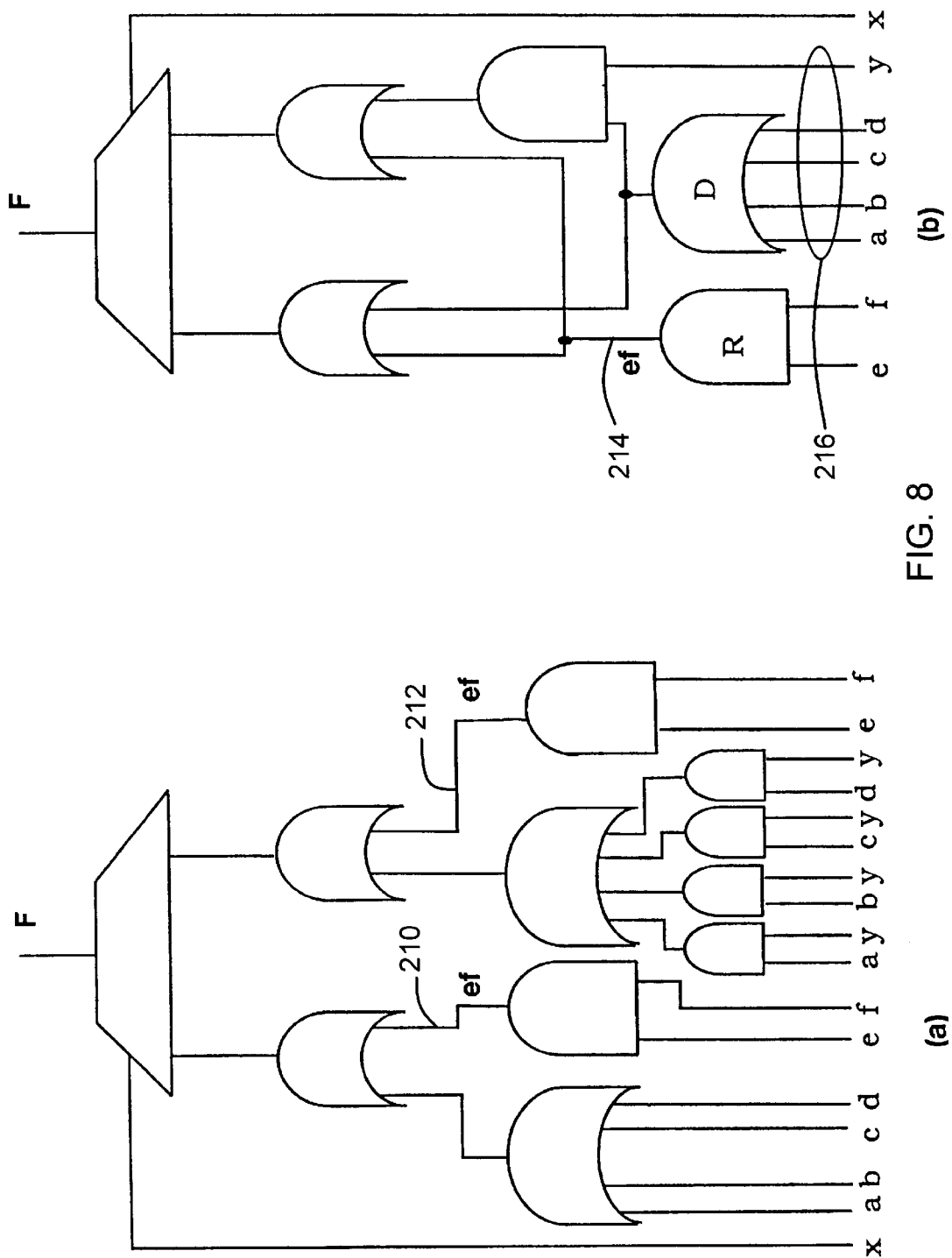
FIG. 8 illustrates a second example of a sub-netlist before (a) and after (b) structure-dependent co-factoring.

FIG. 6 illustrates an example structure-dependent co-factoring computer routine in more detail. For a given input function F at 170 to be cofactored, the routine builds a sub-netlist at 172 which contains F and all its input gates and output gates as illustrated at 174. An example of such a sub-netlist is shown in FIG. 7(a). With this sub-netlist, the routine can accurately analyze the delay when F is implemented. The routine can also estimate the relative coordinates of new cells of F. The computer program performs an algebraic division for the Boolean function F, which gives F=DQ+R as illustrated at 176. Here D is the maximal division of F, Q is the quotient, and R is the remainder of the division. The routine of FIG. 6 thus extracts the biggest common logic elements or groups inside function F. The computer program implements F=DQ+R using NAND and inverter gates for minimizing the arrival time at the output of F, which gives an intermediate sub-netlist illustrated at 178. All logic clusters of D, Q, and R are stored for use in later steps. Because all F's input gates and output gates are in the sub-netlist, the arrival time of each F's input can be calculated and updated in step 178. The routine analyzes the delay of the intermediate sub-netlist, and then determine the critical input of F (say x) in the new implementation so that it is based on both the input arrival time and the input's sensitivity to the function's delay as illustrated at 180.

The routine replaces the input Boolean function F (illustrated at 170) with an updated F=x(DxQx+Rx)+x' (Dx'Qx'+Rx') illustrated at 182, which is the delay-oriented co-factoring result. The updated co-factored function is provided as an output as illustrated at 184. An example of an updated, cofactored netlist is illustrated at FIG. 7(b).

The delay-oriented cofactoring routine has advantages and solves problems encountered with the simple co-factoring algorithm as explained below.

For an example function F=ax+bx+cx+dx+ay+by+cy+dy+ef, if x is the latest arrival signal in the simple implementation of F before remapping, the simple co-factoring algorithm will give F=xF$_x$+x40 F$_{x'}$, F$_x$=a+b+c+d+ef, and F$_{x'}$=ay+by+cy+dy+ef. Its implementation is shown in FIG. 8(a). In FIG, 8(a), it can be seen that the Boolean function is duplicated at nodes 210, 212. With the new routine, the routine first does an algebraic division for F, which gives F=(a+b+c+d)(x+y)+ef. Here D=a+b+c+d, Q=x+y, and R=ef. This operation is predicated on x being the latest arrival signal in the new implementation. The routine calculates Fx=D+R and Fx'=yD+R Because we record the logic clusters R and D, which can then be implemented in FIG. 8(b). The routine reduces the logic duplication (ef in this example) with the cluster R, which helps to optimize the design. In addition, cluster D records the best common logics for F. This also helps to optimize the design. In FIG. 8(b), it can be seen that the Boolean function ef is generated only once at node 214. Also, it can be seen in FIG. 8(b) that inputs a, b, c, d and y at 216 each fan in to only one input.

As another example, suppose f=ax+bx+cx+dx. The arrival time of input d is 0.2 ns and the arrival time of all other inputs is 0.1 ns. So d is the latest arrival signal and will be selected in the traditional cofactoring algorithm, which gives f=df$_d$+d'f$_{d'}$, f$_d$=x, and f$_{d'}$=ax+bx+cx=x(a+b+c). They can then be implemented as shown In FIG. 7(a). The routine of FIG. 6 determines that input x is the variable for cofactoring according to the delay analysis of pre-mapped DQ+R. This input actually is the most sensitive variable to f's delay because it is covered in each cube of f's sum-of-products expression. In this way, the routine implements f as shown in FIG. 7(b). The delays in FIG. 7(a) and FIG. 7(b) can be compared. In FIG. 7(a), paths a→f, b→f and c→f pass through one 2-input AND (190), one 3-input OR (192) and one 3-input MUX (194), whereas in FIG. 8(b), paths a→f, b→f, and c→f pass through one 3-input OR (196), one 2-input OR (198) and one 2-input AND (200). Because the delay of a 3-input MUX is generally larger than that of a 2-input OR, FIG. 7(b) is better optimized than FIG. 7(a) for these three paths. Because these paths are critical paths in both FIG. 7(a) and FIG. 7(b), the routine selects the implementation shown in FIG. 7(b) that has better performance (less delay) than that shown in FIG. 7(a). In addition, the routine can calculate that FIG. 7(b) has less area cost than FIG. 7(a). This also improves optimization of the IC design.

The routine of FIG. 6 implement F=DQ+R to get the intermediate sub-netlist first. The input load can then be updated according to the new netlist structure. The routine records the logic clusters of R, D, and Q. So their implementations are the same if the selected variable is not contained in these clusters. If the variable is contained in the cluster, setting constant 1 and 0 to the cluster can only simplify the logic, thus ensuring that the input load will not increase in the final implementation when compared with the intermediate implementation. This provides better correlation for the input loads between the intermediate implementation and the final implementation, which improves optimization.

If desired, features described above in this application can be combined with features described in our co-pending application, Ser. No. 09/737,239, filed on even date DELAY CALCULATION". As described in this co-pending application here with titled "NETLIST RESYTHESIS PROGRAM BASED ON PHYSICAL DELAY CALCULATION". As describeb in this co-pending application which is hereby incorporated herein by reference, a program improves a netlist of logic nodes and physical placement. The program (a) identifies critical nodes based on time calculated from the physical placement. The program (b) selects a set of critical nodes and optimally collapses their critical fan-ins so that the collapsed sub-netlist can be better remapped. The program (c) builds a subject graph and covers the subject graph with a pattern graph to remap the sub-netlist. The program (d) returns to step (b) if the remapped sub-netlist is unacceptable, returns to step (a) if the remapped sub-netlist is acceptable, and exits at step (a) when no more critical nodes are identified at step (a).

Although the present invention has been described with reference to preferred embodiments, workers skilled in the art will recognize that changes may be made in form and detail without departing from the spirit and scope of the invention.

What is claimed is:

1. A program for improving a netlist of logic nodes and physical placement for an IC, comprising:
   A. identifying critical nodes based on time calculated from the physical placement;
   B. selecting a set of critical nodes and sub-netlists associated with the critical nodes and co-factoring critical fan-ins in the sub-netlist
   C. remapping the sub-netlists by optimization and dynamically estimating and updating fanout loads; and
   D. returning to step B if the remapped sub-netlist is unacceptable, returning to step A if the remapped sub-netlist is acceptable, and exiting at step A when no more critical nodes are identified at step A.

2. The method of claim 1, further comprising:
   E. storing a plurality of sequences of instructions describing, steps A, B, C and D on a computer readable medium, the plurality of sequences of instructions including sequences which, when executed by a processor, cause the processor to generate a final placement for the IC.

3. The method of claim 2 wherein step C includes eliminating logic duplications.

4. The method of claim 2 wherein step B includes co-factoring using the Shannon equation based on delay at the critical nodes.

5. The method of claim 2 wherein steps A, B and C are performed at multiple levels of a hierarchical logic structure.

6. The method of claim 2 wherein technology mapping and a physical delay calculator interact with one another directly to provide an optimum result.

7. The method of claim 1 wherein step B further comprises optimally collapses critical fan-ins so that the collapsed sub-netlist is better remapped, and wherein step C further comprises building a subject graph and covers the subject graph with a pattern graph to remap the sub-netlist.

8. A computer system, comprising:

means for computing;

means for providing a netlist and placement associated with an IC design to the means for computing;

means for identifying critical nodes based on time calculated from the physical placement;

means for selecting a set of critical nodes and sub-netlists associated with the critical nodes and co-factoring critical fan-ins in the sub-netlists;

means for remapping the sub-netlists by optimization and dynamically estimating and updating fanout loads;

means for returning to the means for selecting if the remapped sub-netlist is unacceptable, and means for returning to the means for identifying if the remapped sub-netlist is acceptable, and for exiting when no more critical nodes are identified.

* * * * *